United States Patent
Pope et al.

(10) Patent No.: US 10,537,029 B2
(45) Date of Patent: *Jan. 14, 2020

(54) METHOD FOR REDUCING THIN FILMS ON LOW TEMPERATURE SUBSTRATES

(71) Applicant: NCC Nano, LLC, Dallas, TX (US)

(72) Inventors: Dave S. Pope, Andover, MA (US); Kurt A. Schroder, Coupland, TX (US); Ian M. Rawson, Austin, TX (US)

(73) Assignee: NCC NANO, LLC, Dallas, TX (US)

( * ) Notice: Subject to any disclaimer, the term of this patent is extended or adjusted under 35 U.S.C. 154(b) by 21 days.

This patent is subject to a terminal disclaimer.

(21) Appl. No.: 15/836,556

(22) Filed: Dec. 8, 2017

(65) Prior Publication Data

US 2018/0103546 A1    Apr. 12, 2018

Related U.S. Application Data

(63) Continuation of application No. 14/582,873, filed on Dec. 24, 2014, now Pat. No. 9,839,139, and a
(Continued)

(51) Int. Cl.
*C23C 18/14* (2006.01)
*H05K 3/12* (2006.01)
(Continued)

(52) U.S. Cl.
CPC ......... *H05K 3/1283* (2013.01); *B22F 1/0022* (2013.01); *B22F 3/10* (2013.01); *B22F 3/105* (2013.01); *B22F 9/24* (2013.01); *B29C 35/0805* (2013.01); *B41M 3/001* (2013.01); *B41M 3/006* (2013.01); *B41M 7/0081* (2013.01); *C09D 1/00* (2013.01); *C09D 1/04* (2013.01); *C09D 7/61* (2018.01); *C23C 18/14* (2013.01); *C23C 18/1658* (2013.01); *C23C 18/1667* (2013.01); *C23C 18/1692* (2013.01); *C23C 18/31* (2013.01); *C23C 18/40* (2013.01); *C23C 30/00* (2013.01); *D21H 19/02* (2013.01); *H05K 3/105* (2013.01); *H05K 3/12* (2013.01); *B22F 2001/0033* (2013.01); *B22F 2001/0066* (2013.01); *B29C 35/10* (2013.01);
(Continued)

(58) Field of Classification Search
CPC .. B22F 1/0022; B22F 2001/0066; B22F 3/10; B22F 9/24; B29C 35/0805; B41M 2205/12; B41M 3/006; B41M 5/0047; B41M 5/0064; B41M 7/0081; C09D 1/04; C09D 7/61; C23C 18/14; C23C 18/1692; C23C 18/31; C23C 18/40; H05K 2203/1131; H05K 3/12; H05K 3/1283
USPC .......................................................... 419/45
See application file for complete search history.

(56) References Cited

U.S. PATENT DOCUMENTS 7,820,097 B2 * 10/2010 Schroder ................ B82Y 30/00
                                                            419/45
9,839,139 B2 * 12/2017 Pope ...................... B41M 3/001

* cited by examiner

*Primary Examiner* — Jie Yang
(74) *Attorney, Agent, or Firm* — Anthony P. Ng; Russell Ng PLLC

(57) ABSTRACT

A method for producing an electrically conductive thin film on a substrate is disclosed. Initially, a reducible metal compound and a reducing agent are dispersed in a liquid. The dispersion is then deposited on a substrate as a thin film. The thin film along with the substrate is subsequently exposed to a pulsed electromagnetic emission to chemically react with the reducible metal compound and the reducing agent such that the thin film becomes electrically conductive.

18 Claims, 1 Drawing Sheet

Related U.S. Application Data continuation of application No. 12/411,221, filed on Mar. 25, 2009, now Pat. No. 8,945,686, and a continuation-in-part of application No. 11/720,171, filed on May 24, 2007, now Pat. No. 7,820,097.

(51) Int. Cl.

| | |
|---|---|
| *B41M 7/00* | (2006.01) |
| *C23C 18/16* | (2006.01) |
| *B41M 3/00* | (2006.01) |
| *C23C 18/31* | (2006.01) |
| *B22F 3/10* | (2006.01) |
| *B29C 35/08* | (2006.01) |
| *D21H 19/02* | (2006.01) |
| *B22F 1/00* | (2006.01) |
| *C09D 1/04* | (2006.01) |
| *C23C 30/00* | (2006.01) |
| *B22F 3/105* | (2006.01) |
| *B22F 9/24* | (2006.01) |
| *C09D 1/00* | (2006.01) |
| *C09D 7/61* | (2018.01) |
| *C23C 18/40* | (2006.01) |
| *H05K 3/10* | (2006.01) |
| *B41M 5/00* | (2006.01) |
| *B29C 35/10* | (2006.01) |
| *H05K 1/03* | (2006.01) |

(52) U.S. Cl.
CPC ......... *B41M 5/0035* (2013.01); *B41M 5/0047* (2013.01); *B41M 5/0064* (2013.01); *B41M 7/0072* (2013.01); *B41M 2205/12* (2013.01); *H05K 1/0386* (2013.01); *H05K 2203/013* (2013.01); *H05K 2203/0502* (2013.01); *H05K 2203/10* (2013.01); *H05K 2203/102* (2013.01); *H05K 2203/107* (2013.01); *H05K 2203/1131* (2013.01)

METHOD FOR REDUCING THIN FILMS ON LOW TEMPERATURE SUBSTRATES

RELATED APPLICATIONS

The present application is a divisional application of U.S. Ser. No. 14/582,873, filed on Dec. 24, 2014.

The present application is related to U.S. Ser. No. 61/196,531, filed on Oct. 17, 2008, entitled "Method and Apparatus for Reacting Thin Films on Low Temperature Substrates at High Speeds," which is incorporated herein by reference.

BACKGROUND OF THE INVENTION

1. Technical Field

The present invention relates to curing method in general, and, in particular, to a method for reducing thin filing on low-temperature substrates.

2. Description of Related Art

One approach to making electronic circuits is to print electrical conductors with metallic ink onto a substrate, and the substrate is then heated to sinter the particles of the metallic ink in order to form electrical conducting traces. Generally, most printed metals suitable for electrically conduction need to be heated to a very high temperature, often within a couple hundred degrees centigrade of their melting point, in order to sinter and become conductive.

Two of the most pursued elements for making conductive traces in printed electronics are silver and copper. Silver has two advantages over copper because silver can be heated in air with minimal oxidation and that its oxides, which are comparatively low in conductivity, decompose at relatively low temperatures. These two qualities, coupled with the fact that silver is the most electrically conductive metal often outweigh its high cost when making conductive traces. Thus, even though copper has about 90% of the conductivity of silver and it is usually 50-100 times cheaper on a mass basis, silver inks still dominate the printed electronics market because the additional cost of making and processing copper inks to avoid oxidation is generally higher than the difference in material costs.

It is well-known in the prior art that some metal oxides can be reduced by hydrogen or hydrocarbons at an elevated temperature if they have a positive reduction potential. For example, copper can be first extracted by mixing copper oxide bearing ore with charcoal along with an application of heat. When oxidized copper particles or ever pure copper oxide is heated in the presence of a reducer, the oxidized copper particles can sinter to form a conductor.

When making thin film conductors by printing copper particles, a very conductive trace can be formed if the particles are heated to their sintering temperature in an inert Or reducing atmosphere. Since the inciting point of copper is nearly 1,085° C., the temperature required for sintering dictates that only high temperature substrates such as glass or ceramic can be used. Such high-temperature requirement prevents the usage of inexpensive substrates such as paper or plastic.

Alternatively, if a copper particle film is deposited on a low-temperature substrate, it can be heated to near the substrate's decomposition temperature and then be placed in a reducing atmosphere, but the low temperature dramatically increases the amount of time needed for curing from seconds to minutes or even hours, depending on the thickness of the film and the temperature. At low temperatures, sintering is very limited, and thus the film resistivity becomes high. Furthermore, the need for an inert or reducing atmosphere also dramatically increases processing cost. Thus, it would be desirable to provide an improved method for rapidly reducing metal oxide on low-temperature substrates in ambient atmosphere.

SUMMARY OF THE INVENTION

In accordance with a preferred embodiment of the present invention, a reducible metal compound and a reducing agent are initially dispersed in a liquid, such as water. The dispersion is then deposited on a substrate as a thin film. The thin film along with the substrate is subsequently exposed to a pulsed electromagnetic emission to chemically react with the reducible metal compound and the reducing agent such that the thin film becomes electrically conductive.

All features and advantages of the present invention will become apparent in the following detailed written description.

BRIEF DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DETAILED DESCRIPTION OF A PREFERRED EMBODIMENT

For the present invention, curing is defined as thermal processing, which includes reducing a metal compound contained within a thin film on a low-temperature substrate. A thin film is defined as a coating of less than 100 microns thick. Examples of low-temperature substrates include paper, plastic or polymer.

The present invention is a method for providing activation energy to perform a reduction-oxidation reaction in a thin film using intense pulsed light. The redox reaction may be the reduction of a metal oxide by an organic compound and may be performed on a low-temperature substrate.

Figure 1:
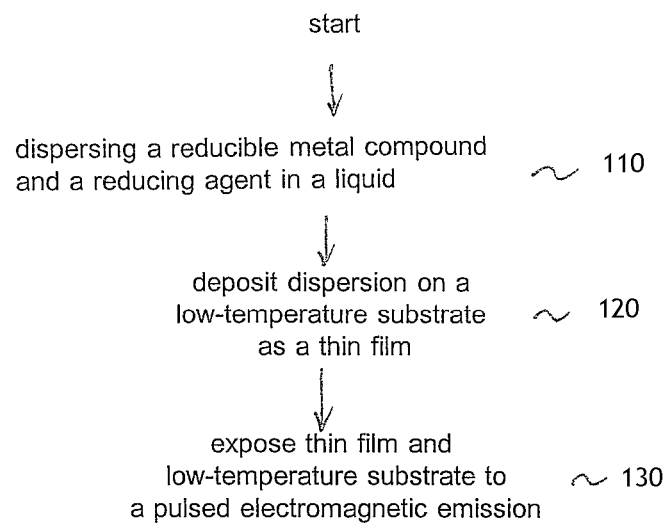
FIG. 1 is a flow diagram of a method for curing a thin film on a low-temperature substrate, in accordance with a preferred embodiment of the present invention.

Referring now to the drawings and in particular to FIG. 1, there is depicted a flow diagram of a method for curing a thin film on a low-temperature substrate, in accordance with a preferred embodiment of the present invention. Starting in block 100, a non-conducting metal oxide is dispersed in a liquid, such as water, using any number of common dispersing agents such as polyvinylpyrrolidone or polystyrene-acrylate copolymers, as shown in block 110. The dispersion also includes at least one reducing, agent. The reducing agent may be any of a number of compounds including alcohols, aldehydes, carboxylic acids and carbon black. Reducing agents preferably include glycerol, ascorbic acid, 1,2-hexanediol and glutaric acid. Other additives may include various surfactants for surface wetting humectants, co-solvents, and binder resins. The dispersion may include conducting particles such as silver, copper, or gold. The dispersion may also contain partially oxidized metal particles. The non-conducting metal oxide can be any metal oxide listed in Table 1.

TABLE I

| | |
|---|---|
| $MoO_2$, $MoO_3$ | molybdenum oxide |
| $WO_3$, $WO_3$ | tungsten oxide |
| $ReO_2$, $Re_2O_5$, $ReO_3$ | rhenium oxide |
| $FeO$, $Fe_2O_3$ | iron oxide |
| $RuO_2$ | ruthenium oxide |
| $OsO_2$ | osmium oxide |
| $CoO$, $Co_3O_4$ | cabalt oxide |
| $Rh_2O_3$, $RhO_2$ | rhodium oxide |
| $IrO_2$ | iridium oxide |
| $NiO$ | nickel oxide |
| $PdO$ | palladium oxide |
| $PtO_2$ | platinum oxide |
| $Cu_2O$, $CuO$ | copper oxide |
| $Ag_2O$ | silver oxide |
| $Ag_2O_3$ | gold oxide |
| $ZnO$ | zinc oxide |
| $CdO$ | cadmium oxide |
| $In_2O_3$ | indium oxide |
| $GeO$, $GeO_2$ | germanium oxide |
| $SnO$, $SnO_2$ | tin oxide |
| $PbO$, $PbO_3$ | lead oxide |
| $Sb_2O_3$, $Sb_2O_4$, $Sb_2O_5$ | antimony oxide |
| $Bi_2O_3$ | bismuth oxide |

The dispersion is then deposited on a low-temperature substrate as a thin film, as depicted in block 120. The low-temperature substrate can be polymer (polyimide, polyethylene terephthalate, polyethylene naphthalate, polyethylene, polycarbonate, polystyrene, polyvinyl chloride, etc.), paper, etc. The dispersion may be deposited on a low-temperature substrate by any common printing technique including inkjet, gravure, flexographic, rollcoating, screen-printing and the like. Conversely, the non-conducting metal oxide and reducer (i.e., reducing agent) may be deposited on a low-temperature substrate as a thin film using a dry deposition process such as xerography.

The thin film along with, the low-temperature substrate are subsequently exposed to a pulsed electromagnetic emission in order to initiate a redox reaction between the non-conducting metal oxide and reducer on the low-temperature substrate, as shown in block 130. The pulsed electromagnetic source can be a laser, flash lamp, directed plasma arc lamp, microwave, or radiofrequency induction heater capable of delivering a pulse length of less than 20 ms. An alternative embodiment is the use of an electron beam or intense arc lamp to deposit heat into the film to initiate the redox reaction as the film is being conveyed past the source of radiation. For the electron beam and arc lamp sources, the combination of a moving substrate and a static source has the effect of providing pulsed heating of the film. The electromagnetic source should have an emission greater than 500 W/cm$^2$. As a result of the exposure, the thin film is rendered electrically conductive after the redox reaction.

Preferably, the thin film is cured while the low-temperature substrate is being conveyed past the light source using an automated curing apparatus as described below.

Figure 2:
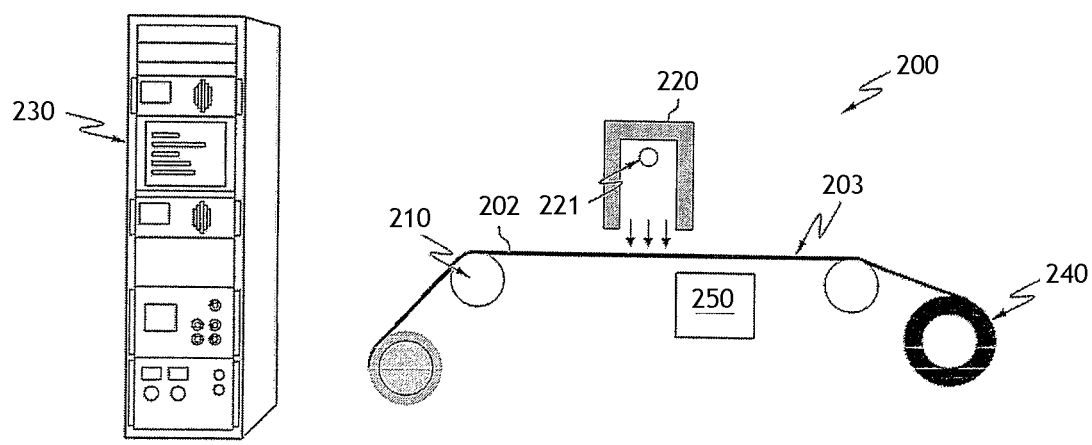
FIG. 2 is a diagram of a curing apparatus, in accordance with a preferred embodiment of the present invention.

With reference now to FIG. 2, there is illustrated a diagram of a curing apparatus for curing thin films on low-temperature substrates, in accordance with a preferred embodiment of the present invention. As shown, a curing apparatus 200 includes a conveyor system 210, a strobe head 220, a relay rack 230 and a reel-to-reel feeding system 240. Curing apparatus 200 is capable of curing a thin film 202 mounted on a low-temperature substrate 203 situated on a web being conveying past strobe head 220 at a relatively high speed. Conveyor system 210 can preferably operate at speeds from 2 to 1000 feet/min to move substrate 203. Curing apparatus 200 can preferably accommodate a web width of any width in 6-inch increments. Thin film 202 can be added on substrate 203 by one or combinations of existing technologies such as screen-printing, inkjet printing, gravure, laser printing, xerography, pad printing, painting, dip-pen, syringe, airbrush, flexographic, CVD, PECVD, evaporation, sputtering, etc. The deposition of thin film 202 onto substrate 203 may be performed inline with the curing process.

Strobe head 220, which is preferably water cooled, includes a high-intensity pulsed xenon flash lamp 221 for curing thin film 202 located on substrate 203. Pulsed xenon flash lamp 221 can provide pulses of different intensity, pulse length, and pulse repetition frequency. For example, pulsed xenon lamp 221 can provide 10 µs to 10 ms pulses with a 3" by 6" wide footprint at a pulse repetition rate of up to 1 kHz. The spectral content of the emissions from pulsed xenon flash lamp 221 ranges from 200 nm to 2,500 nm. The spectrum can be adjusted by replacing the quartz lamp with a cerium doped quartz lamp to remove most of the emission below 350 nm. The quartz lamp can also be replaced with a sapphire lamp to extend the emission from approximately 140 nm to approximately 4,500 nm. Filters may also be added to remove other portions of the spectrum. Flash lamp 221 can also be a water wall flash lamp that is sometimes referred to as a Directed Plasma Arc (DPA) lamp.

Relay rack 230 includes an adjustable power supply, a conveyance control module, and a strobe control module. The adjustable power supply can produce pulses with an energy of up to 4 kilojoules per pulse. Adjustable power supply is connected to pulsed xenon flash lamp 221, and the intensity of the emission from pulsed xenon flash lamp 221 can be varied by controlling the amount of current passing through pulsed xenon flash lamp 221.

The adjustable power supply controls the emission intensity of pulsed xenon flash lamp 221. The power, pulse duration and pulse repetition frequency of the emission from pulsed xenon flash lamp 221 are electronically adjusted and synchronized to the web speed to allow optimum curing of thin film 202 without damaging substrate 203, depending on the optical, thermal and geometric properties of thin film 202 and substrate 203.

During the curing operation, substrate 203 as well as thin film 202 are being moved by conveyor system 210. Conveyor system 210 moves thin film 202 under strobe head 220 where thin film 202 is cured by rapid pulses from pulsed xenon flash lamp 221. The power, duration and repetition rate of the emissions from pulsed xenon flash lamp 221 are controlled by strobe control module, and the speed at which substrate 203 is being moved past strobe head 220 is determined by conveyor control module.

A sensor 250, which can be mechanical, electrical, or optical, is utilized to sense the speed of conveyor system 210. For example, the conveyor belt speed of conveyor belt system 210 can be sensed by detecting a signal from a shaft encoder connected to a wheel that makes contact with the moving conveyor belt. In turn, the pulse repetition rate can be synchronized with the conveyor belt speed of conveyor belt system 210. The synchronization of the strobe pulse rate f is given by:

$$f = 0.2 * s * o/w$$

where
s=web speed [ft/min]
o=overlap factor
w=curing head width [in]

Overlap factor is the average number of strobe pulses that are received by a substrate at any one location. For example, with a web speed of 200 ft/min, an overlap factor of 5, and a curing head width of 2.75 inches, the pulse rate of the strobe is 72.7 Hz.

When flash lamp 221 is pulsed, thin film 202 is momentarily heated to provide activation energy for a redox reaction. When a rapid pulse train is combined with moving substrate 203, a uniform cure can be attained over an arbitrarily large area as each section of thin film 202 may be exposed to multiple pulses, which approximates a continuous curing system such as an oven.

Unlike the prior art, in which reducers or fluxes have been introduced to remove oxide from metal particles before curing, the method of the present invention places a reducer directly in a thin film along with the oxide to be reduced by an intense pulsed light. The process can be performed in air because the requirement of an inert or reducing environment is obviated by the brief time of the reaction. Basically, the thin film is heated briefly to a high enough temperature in order for the reducer and the oxide to react, but the time of the reaction is brief enough to prevent significant chemical reaction with the air.

As a result of the intense pulsed light, the metal oxide is reduced by the reducer in the film resulting m a thin film of metal. Although the radiated power per unit area from the pulsed light source is very high (~2 $KW/cm^2$), the pulse duration is so short that little energy (~2 $J/cm^2$) is deposited on substrate 103. Hence, substrate 103 is undamaged. Thus, the method of present invention allows a high-temperature redox reaction to our on a thermally fragile substrate such a plastic or paper. The process happens so quickly that oxidation of the metal in air is minimal, so an inert or reducing atmosphere is not needed. In addition to reducing the metal oxide, the intense pulsed light has the added benefit of sintering the metal particles to form a highly conductive trace without damaging the substrate. Both the reduction and the sintering appear to happen from each pulse of light.

As an alternative embodiment, the reducer is a metal with a negative reduction potential, such as aluminum, magnesium, or lithium. This allows the reduction of materials that do not have a positive reduction potential. The reducing metal may be in particulate or film form.

As another alternative embodiment, a method for cleaning or reacting with a surface is performed by depositing a reacting film on a surface and exposing the film to an intense pulsed light to react the film with the surface. In short, a relatively innocuous chemical heated to a very high temperature can have a similar chemical activity as a relatively dangerous one at room temperature. Applications include cleaning agents, surface preparation, etc. Since a relatively innocuous agent is only very active at high temperature, this means that a safer, and potentially more environmental cleaning agent can be used in place of a more dangerous one. Storage of such an agent is safer, and disposal of the agent after use is more inexpensive and environmental.

The following paragraph illustrates what is happening to a thin film during the process of the present invention. A typical thickness of a thin film is 1 micron, and the typical thickness of a substrate is 150 microns (6 mils). A preferred pulse on a copper oxide/organic reducer based films, is 330 V with a 1,000 microsecond pulse length. This setting corresponds to a radiant exposure of 1.7 $J/cm^2$ or an average radiated power of 1.7 $KW/cm^2$. Ignoring the radiation losses, energy absorbed by evaporation of solvent, energy absorbed by melting of the PET at the interface of the thin film, and energy liberated from the redox reaction being performed a thermal simulation of the system assuming natural convection losses at the interfaces. Assuming the curing apparatus from FIG. 1 is at room temperature (25° C.) before the pulse, the calculated the peak temperature of the thin film at the end of the 1 ms pulse is about 1,040° C. The entire film/substrate returned to below the published 150° C. decomposition temperature of PET within 25 ms. This heating is performed with no apparent damage to the substrate. However, unlike a, typical convection oven set at the published decomposition temperature of PET, the considerably higher peak temperature provides ample activation energy for the redox reaction to occur. Since the redox reaction is certainly completed in a time frame shorter than 25 ms, there is not adequate time for the copper to be oxidized by the air. Hence, the redox reaction occurs and oxidation of the copper does not. Thus, a highly conductive copper film is created. Also, given the temperature that the thin film reaches, the resulting copper particles are also sintered by the pulse of light. The sintering has the effect of increasing both the electrical conductivity and stability of the film.

One advantage of the method of the present invention is that the reduction can be completed very rapidly, which makes it compatible with high-speed printing and web handling techniques. As a result, high temperature processing can be performed on inexpensive, low temperature substrates such as paper, plastic, or polymer. Another advantage of the method of the present invention is that the reduction can be performed in an ambient environment such as air. A further advantage of the method of the present invention is that copper, oxidized copper, or even copper oxide can be deposited on substrates and cured to resistivities rivaling printed silver at a cost dramatically lower than silver. More specifically, copper oxidizes when it is heated in air. This invention allows the curing of copper particles in air rendering a highly conductive film regardless of their level of oxidation.

As has been described, the present invention provides a method for rapidly reducing thin films on low-temperature substrates.

EXAMPLES

Example 1—Ascorbic Acid Reducer

A copper oxide dispersion was produced by mixing 3.0 g<50 nm copper (II) oxide, 3.6 g deionized water, 0.15 g PVP K-30, 0.3 g ethylene glycol, 0.04 g Tergitol® TMN-6, 0.02 g Dynol® 604, 0.02 g BYK®-020, and 0.66 g ascorbic acid in a 20 mL vial. 5 g of zirconium oxide milling media was added and the vial was agitated for 60 minutes.

The dispersion was applied to a sheet of Melinex® ST505 PET by drawdown using a #5 Meyer bar.

The sample was cured with a pulse length of 1,000 microseconds, and overlap factor of 2 at 24 feet per minute in an air environment. Although the film was not electrically conductive, the color of the film changed from dark brown to a copper color indicating significant conversion of the copper oxide to copper.

Example 2—Ethylene Glycol/Glycerol Reducer

A copper oxide dispersion was produced by mixing 2.0 g NanoArc® copper oxide, 5.7 g deionized water, 0.10 g PVP K-30, 0.6 g ethylene glycol, 0.03 g Tergitol® TMN-6, 0.01 g Dynol® 604, and 0.32 g glycerol in a 20 mL vial. 5 g of zirconium oxide milling media was added and the vial was agitated for 60 minutes.

The dispersion was applied to a sheet of Melinex® ST505 PET by drawdown using a #5 Meyer bar.

The sample was cured with a pulse length of 850 microseconds, and overlap factor of 2 at 24 feet per minute in an air environment. Although the film was not electrically conductive, the color of the film changed from dark brown to a copper color indicating significant conversion of the copper oxide to copper.

Example 3—Ethylene Glycol/Glycerol Reducer

A copper oxide dispersion was produced by mixing 2.0 g NanoArc® copper oxide, 5.4 g deionized water, 0.10 g PVP K-30, 0.6 g ethylene glycol, 0.03 g Tergitol® TMN-6, 0.01 g Dynol® 604, and 0.67 g glycerol in a 20 mL vial. 5 g of zirconium oxide milling media was added and the vial was agitated for 60 minutes.

The dispersion was applied to a sheet of Melinex® ST505 PET by drawdown using a #5 Meyer bar.

The sample was cured with a pulse length of 1,000 microseconds, and overlap factor of 3 at 24 feet per minute in an air environment. Although the film was not electrically conductive, the color of the film changed from lark brown to a copper color indicating significant conversion of the copper oxide to copper.

Example 4—Ethylene Glycol/Glycerol Reducer

A copper oxide dispersion was produced by mixing 2.0 g NanoArc® copper oxide, 4.9 g deionized water, 0.10 g PVP K-30, 0.5 g ethylene glycol, 0.03 g Tergitol® TMN-6, 0.01 g Dynol® 604, and 1.32 g glycerol in a 20 mL vial. 5 g of zirconium oxide milling media was added and the vial was agitated for 60 minutes.

The dispersion was applied to a sheet of Melinex® ST505 PET by drawdown using a #5 Meyer bar.

The sample was cured with a single pulse at 750V with a pulse length of 2,300 in an air environment. The color of the film changed from dark brown to a copper color indicating significant conversion of the copper oxide to copper. The sheet resistance of the film was 4.1 Ω/sq.

Example 5—Glucose Reducer

A copper oxide dispersion was produced by mixing 1.75 g NanoArc® copper oxide, 5.3 g deionized water, 0.09 g PVP K-30, 0.6 g ethylene glycol, 0.02 g Tergitol® TMN-6, 0.01 g Dynol® 604, and 0.79 g glucose in a 20 mL vial. 5 g of zirconium oxide milling media was added and the vial was agitated for 60 minutes.

The dispersion was applied to a sheet of Melinex® ST505 PET by drawdown using a #5 Meyer bar. Separately, the dispersion was applied to a sheet of Epson Photo Paper by drawdown using a #5 Meyer bar.

The sample was cured with a pulse length of 400 microseconds, and overlap factor of 2 at 24 feet per minute for three passes in an air environment. Although the film was not electrically conductive, the color of the film changed from dark brown to a copper color indicating significant conversion of the copper oxide to copper.

Example 6—Glucose Reducer

A copper oxide dispersion was produced by mixing 1.75 g NanoArc® copper oxide, 5.3 g deionized water, 0.09 g PVP K-30, 0.6 g ethylene glycol, 0.02 g Tergitol® TMN-6, 0.01 g Dynol® 604, and 1.59 g glucose in a 20 mL vial. 5 g of zirconium oxide milling media was added and the vial was agitated for 60 minutes.

The dispersion was applied to a sheet of Melinex® ST505 PET by drawdown using a #5 Meyer bar.

The sample was cured with a pulse length of 500 microseconds, and overlap factor of 2 at 24 feet per minute in an air environment. The color of the film changed from dark brown to a copper color indicating significant conversion of the copper oxide to copper. The sheet resistance of the film was 2.2 Ω/sq.

Example 7—Hexanediol Reducer

A copper oxide dispersion was produced by mixing 1.5 g NanoArc® copper oxide, 7.5 g deionized water, 0.08 g PVP K-30, 0.8 g ethylene glycol, 0.03 g Tergitol® TMN-6, 0.02 g Dynol® 604, and 0.47 g 1,2-hexanediol in a 20 mL vial. 5 g of zirconium oxide milling media was added and the vial was agitated for 60 initiates.

The dispersion was applied to a sheet of Melinex® ST505 PET by drawdown using a #5 Meyer bar.

The sample was cured with a pulse length of 600 microseconds, and overlap factor of 2 at 24 feet per minute in an air environment. Although the film was not electrically conductive, the color of the film changed from dark brown to a copper color indicating significant conversion of the copper oxide to copper.

Example 8—Glutaric Acid Reducer

A copper oxide dispersion was produced by mixing 1.5 g<50 nm copper (II) oxide, 6.8 g deionized water, 0.08 g PVP K-30, 0.8 g ethylene glycol, 0.03 g Tergitol® TMN-6, 0.02 g Dynol® 604, and 0.47 glutaric acid in a 20 mL vial. 5 g of zirconium oxide milling media was added and the vial was agitated for 60 minutes.

The dispersion was applied to a sheet of Melinex® ST505 PET by drawdown using a #5 Meyer bar.

The sample was cured with a pulse length of 1,200 microseconds, and overlap factor of 3 at 25 feet per minute in an air environment. The color of the film changed from dark brown to a copper color indicating significant conversion of the copper oxide to copper. The sheet resistance of the film was 2.7 Ω/sq.

Example 9—Polyacrylamide Reducer

A copper oxide dispersion was produced by mixing 1.75 g NanoArc® copper oxide, 5.3 g deionized water, 0.09 g PVP K-30, 0.6 g ethylene glycol, 0.02 g Tergitol® TMN-6, 0.01 g Dynol® 604, and 1.25 g polyacrylamide in a 20 mL vial. 5 g of zirconium oxide milling media was added and the vial was agitated for 60 minutes.

The dispersion was applied to a sheet of Melinex® ST505 PET by drawdown using a #5 Meyer bar.

The sample was cured with a pulse length of 800 microseconds, and overlap factor of 2 at 24 feet per minute in an air environment. Although the thin was not electrically conductive, the color of the film changed from dark brown to a copper color indicating significant conversion of the copper oxide to copper.

Example 10—Pentaerythritol Reducer

A copper oxide dispersion was produced by mixing 1.75 g NanoArc® copper oxide, 5.3 g deionized water, 0.09 g PVP K-30, 0.6 g ethylene glycol, 0.02 g Tergitol® TMN-6, 0.01 g Dynol® 604, and 0.90 g pentaerythritol in a 20 mL vial. 5 g of zirconium oxide milling media was added and the vial was agitated for 60 minutes.

The dispersion was applied to a sheet of Melinex® ST505 PET by drawdown using a #5 Meyer bar.

The sample was cured With a pulse length of 600 microseconds, and overlap factor of 2 at 24 feet per minute in an air environment. Although the film was not electrically conductive, the color of the film changed from dark brown to a copper color indicating significant conversion of the copper oxide to copper.

Example 11—Succinic Acid Reducer

A copper oxide dispersion was produced by mixing 1.75 g NanoArc® copper oxide, 5.3 g deionized water, 0.09 g PVP K-30, 0.6 g ethylene glycol, 0.02 g Tergitol® TMN-6, 0.01 g Dynol® 604, and 0.71 g succinic acid (sodium salt) in a 20 mL vial. 5 g of zirconium oxide milling media was added and the vial was agitated for 60 minutes.

The dispersion was applied to a sheet of Melinex® ST505 PET by drawdown using a #5 Meyer bar.

The sample was cured with a pulse length of 700 microseconds, and overlap factor of 4 at 24 feet per minute in an air environment. Although the film was not electrically conductive, the color of the film changed from dark brown to a copper color indicating significant conversion of the copper oxide to copper.

Example 12—Carbon Reducer

A copper oxide dispersion was produced by mixing 1.75 g NanoArc® copper oxide, 5.3 g deionized water, 0.09 g PVP K-30, 0.6 g ethylene glycol, 0.02 g Tergitol® TMN-6, 0.01 g Dynol® 604, and 0.32 g carbon black in a 20 mL vial. 5 g of zirconium oxide milling media was added and the vial was agitated for 60 minutes.

The dispersion was applied to a sheet of Melinex® ST505 PET by drawdown using a 45 Meyer bar.

The sample was cured with a pulse length of 500 microseconds, and overlap factor of 2 at 24 feet per minute for four passes in an air environment. Although the film was not electrically conductive, the color of the film changed from dark brown to a copper color indicating significant conversion of the copper oxide to copper.

Example 13—Uric Acid Reducer

A copper oxide dispersion was produced by mixing 1.75 g NanoArc® copper oxide, 5.3 g deionized water, 0.09 g PVP K-30, 0.6 g ethylene glycol, 0.02 g Tergitol® TMN-6, 0.01 g Dynol® 604, and 0.89 g uric acid in a 20 mL vial. 5 g of zirconium oxide milling media was added and the vial was agitated for 60 minutes.

The dispersion was applied to a sheet of Melinex® ST505 PET by drawdown using a #5 Meyer bar.

The sample was cured with a pulse length of 600 microseconds, and overlap factor of 2 at 24 feet per minute for four passes in an air environment. Although the film was not electrically conductive, the color of the film changed from dark, brown to a copper color indicating significant conversion of the copper oxide to copper.

Example 14—Inkjet with Glycerol Reducer

A copper oxide dispersion was produced by first milling a mixture of 52.5 g NanoArc® copper oxide, 2.6 g PVP K-30, and 294.9 g deionized water. The resulting average particle size was 115 nm. An inkjet ink was produced by mixing 8.4 g of the milled copper oxide dispersion, 1.0 g glycerol, 0.5 g ethylene glycol, 0.04 g Triton® X-100, and 0.03 g BYK®-020.

The inkjet ink was printed using, a desktop inkjet printer onto Pictorico brand PET.

The sample was cured with a pulse length of 300 microseconds, and overlap factor of 2 at 24 feet per minute in an air environment. The color of the film changed from dark brown to a copper color indicating significant conversion of the copper oxide to copper. The sheet resistance of the film was 1 ω/sq.

Example 15—Copper Powder with Ascorbic Acid and Glycerol Reducer

A copper dispersion was produced by mixing 2.5 g of Mitsui copper powder, 0.04 g of BYK®-020, 0.04 g of Tergitol® TMN-6, 0.25 g of PVP K-30, 0.89 g of glycerol, 0.45 g of ethylene glycol, 0.76 g of ascorbic acid in 7.57 g of deionized water.

The dispersion was applied to a sheet of Pictorico brand PET by drawdown using a #10 Meyer bar.

The sample was cured with a pulse length of 1,000 microseconds, and overlap factor of 4 at 24 feet per minute in an air environment. The color of the film changed from dark brown to a copper color indicating significant conversion of the copper oxide to copper. The sheet resistance of the film was 40 mΩ/sq. Assuming the film was fully dense, it was 1.3 microns thick and thus had a bulk conductivity of 5.2 Ω-cm or 3.0 times the bulk resistivity of pure copper.

Example 16—Inkjet with Ascorbic Acid Reducer

A copper oxide dispersion was produced by first milling a mixture of 52.5 g NanoArc® copper oxide, 2.6 g PVP K-30, and 294.9 g deionized water. The resulting average particle size was 115 nm. A first inkjet ink was produced by mixing 8.4 g of the milled copper oxide dispersion, 1.0 glycerol 0.5 g ethylene glycol, 0.04 g Triton® X-100, and 0.03 g BYK®-020. A second inkjet ink was produced by mixing 0.1 g of BYK®-020, 0.2 g of Triton® X-100, 10.0 g of ascorbic acid, 3.0 g of ethylene glycol, 4.5 g of glycerol in 42.5 g of deionized water.

Both inkjet inks were printed sequentially using an inkjet printer onto Pictorico brand PET.

The sample was cured with a pulse length of 1,000 microseconds, and overlap factor of 1 at 24 feet per minute in an air environment. The color of the film changed from dark brown to a copper color indicating significant conversion of the copper oxide to copper. The film was estimated to be 0.3 micron thick and had a sheet resistance of 140 mΩ/sq indicating a bulk conductivity of 4.1 micro Ω-cm or 2.4 times the bulk resistivity of pure copper.

All of the above-mentioned examples were prepared identically and placed in an oven containing an air environment at 150° C. for 30 minutes. In all cases, there was no visual evidence of conversion or conductivity of the film. Higher oven temperatures were not possible since the highest working temperature of PET is 150° C. When higher temperature substrates, such as Kaptan or glass were used, no conversion was seen even at temperatures up to 800® C.

Example 17—Copper Sulphate with Ascorbic Acid Reducer

A first solution was made with 20 wt % $CuSO_4.5H_2O$ in deionized water. A second solution was produced by mixing 0.1 g of BYK®-020, 0.2 g of Triton® X-100, 10.0 g of ascorbic acid, 3.0 g of ethylene glycol, 4.5 g of glycerol in 42.5 g of deionized water.

The first solution was deposited on ordinary photocopy paper by drawdown using a #10 Meyer bar. This was followed by a deposition of the second solution by drawdown using a #5 bar.

The sample was cured with a pulse length of 1,000 microseconds, and overlap factor of 4 at 24 feet per minute for three passes in an air environment. Although the film was not electrically conductive, the color of the film changed from dark brown to a copper color indicating significant conversion of the copper oxide to copper. Under a low magnification microscope it was observed that the copper coated the fibers of the paper.

Example 18—Aluminum Reducer

A dispersion was made with 0.29 g of Valimet-H2 aluminum powder, 0.77 g of <5 micron copper (II) oxide from Sigma-Aldrich, 0.11 g of PVP K-30 in 6.0 g of deionized water.

The dispersion was applied to a sheet of Pictorico brand PET by drawdown using a #10 Meyer bar.

The sample was cured with a pulse length of 1,000 microseconds, and overlap factor of 2 at 28 feet per minute in an air environment. Although the film was not electrically conductive, the film converted from a dark brown to a copper color.

In contrast, identical films were prepared in all of the above examples were placed in an oven containing an air atmosphere at 150° C. for 30 minutes. 150° C. was chosen since it is the highest working temperature for PET. No conversion was observed, and no films had any measurable electrical resistance (greater than 400 MΩ/square).

While the invention has been particularly shown and described with reference to a preferred embodiment, it will be understood by those skilled in the art that various changes in form and detail may be made therein without departing from the spirit and scope of the invention.

What is claimed is:

1. A method comprising:
dispersing an organic reducer and a metal oxide in a liquid;
depositing said dispersion on a substrate as a non-conductive thin film, wherein said depositing is performed by printing; and
exposing said non-conductive thin film to a single pulsed electromagnetic emission in an ambient atmosphere for said organic reducer to initially react with said metal oxide chemically via a redox reaction to form metal particles, and for sintering said metal particles to render said thin film from electrically non-conductive to electrically conductive, wherein said pulsed electromagnetic emission has a pulse length less than 20 ms and a radiated power more than 2 KW/cm$^2$.

2. The method of claim 1, wherein said substrate is paper.

3. The method of claim 1, wherein said substrate is polyethylene terephthalate (PET).

4. The method of claim 1, wherein said substrate is polymer.

5. The method of claim 1, wherein said initial redox reaction and said sintering occur within said single pulsed electromagnetic emission.

6. The method of claim 1, wherein said reducer is polyvinylpyrrolidone (PVP).

7. The method of claim 1, wherein said reducer is ascorbic acid.

8. The method of claim 1, wherein said reducer is ethylene glycol/glycerol.

9. The method of claim 1, wherein said metal oxide is copper oxide.

10. The method of claim 1, wherein said pulsed electromagnetic emission is generated by any one of a laser, a flash lamp, a directed plasma arc lamp, microwave, a radio-frequency induction heater, an electron beam, and an arc lamp.

11. A method comprising:
dispersing an organic reducer and a metal oxide in a liquid;
depositing said dispersion on a substrate as a non-conductive thin film; and
exposing said non-conductive thin film to a single pulsed electromagnetic emission in an ambient atmosphere for said organic reducer to initially react with said metal oxide chemically via a redox reaction to form metal particles, and for sintering said metal particles to render said thin film from electrically non-conductive to electrically conductive, wherein said pulsed electromagnetic emission is greater than 500 W/cm$^2$, wherein said pulsed electromagnetic emission has a pulse length less than 20 ms and a radiated power more than 2 KW/cm$^2$.

12. The method of claim 11, wherein said substrate is paper.

13. The method of claim 11, wherein said substrate is polyethylene terephthalate (PET).

14. The method of claim 11, wherein said substrate is polymer.

15. The method of claim 11, wherein said reducer is polyvinylpyrrolidone (PVP).

16. The method of claim 11, wherein said reducer is ascorbic acid.

17. The method of claim 11, wherein said reducer is ethylene glycol/glycerol.

18. The method of claim 11, wherein said metal oxide is copper oxide.

* * * * *